(12) United States Patent
Bayram et al.

(10) Patent No.: US 10,359,493 B2
(45) Date of Patent: Jul. 23, 2019

(54) MRI SYSTEM AND METHOD FOR PERFORMING TIME RESOLVED MR IMAGING OF AN OBJECT WITH GROUPED DATA ACQUISITION

(71) Applicant: General Electric Company, Schenectady, NY (US)

(72) Inventors: Ersin Bayram, Houston, TX (US); Naoyuki Takei, Tokyo (JP); Yuji Iwadate, Tokyo (JP); Kang Wang, Verona, WI (US); Lloyd Estkowski, San Jose, CA (US)

(73) Assignee: General Electric Company, Schenectady, NY (US)

( * ) Notice: Subject to any disclaimer, the term of this patent is extended or adjusted under 35 U.S.C. 154(b) by 218 days.

(21) Appl. No.: 15/395,167

(22) Filed: Dec. 30, 2016

(65) Prior Publication Data

US 2018/0188344 A1     Jul. 5, 2018

(51) Int. Cl.
*G01V 3/00* (2006.01)
*G01R 33/567* (2006.01)
*G01R 33/48* (2006.01)
*G01R 33/56* (2006.01)
*G01R 33/561* (2006.01)

(52) U.S. Cl.
CPC ..... *G01R 33/5673* (2013.01); *G01R 33/4818* (2013.01); *G01R 33/5607* (2013.01); *G01R 33/5619* (2013.01); *G01R 33/5601* (2013.01)

(58) Field of Classification Search
CPC .............. G01R 33/543; G01R 33/5659; G01R 33/3415; G01R 33/36; A61B 5/055

USPC ......................................................... 324/309
See application file for complete search history.

(56) References Cited

U.S. PATENT DOCUMENTS

| 5,278,501 | A | * | 1/1994 | Guilfoyle | G01R 33/4816 |
|---|---|---|---|---|---|
| | | | | | 324/300 |
| 5,435,303 | A | | 7/1995 | Bernstein et al. | |
| 5,713,358 | A | * | 2/1998 | Mistretta | G01R 33/5619 |
| | | | | | 324/306 |
| 6,380,740 | B1 | | 4/2002 | Laub | |
| 8,653,817 | B2 | | 2/2014 | Busse et al. | |
| 2004/0210129 | A1 | * | 10/2004 | Riederer | G01R 33/4824 |
| | | | | | 600/415 |

(Continued)

OTHER PUBLICATIONS

T.A. Cashen, et al; Intracranial Time-Resolved Contrast-Enhanced MR Angiography at 3T; AJNR Am J Neuroradiol 27; Apr. 2006; pp. 822-829.

*Primary Examiner* — Walter L Lindsay, Jr.
*Assistant Examiner* — Frederick Wenderoth
(74) *Attorney, Agent, or Firm* — Grogan, Tuccillo & Vanderleeden, LLP (57) ABSTRACT

An MRI system for performing time resolved MR imaging of an object with grouped data acquisition is provided. The MRI system includes an MRI controller in electronic communication with a magnet assembly and operative to sample a group of data points within a first region of a k-space. The first region includes a central sub-region and a first peripheral sub-region. The MRI controller is further operative to sample a group of data points within a second region of the k-space. The second region includes the central sub-region and a second peripheral sub-region different from the first peripheral sub-region.

20 Claims, 6 Drawing Sheets

(56) References Cited

U.S. PATENT DOCUMENTS

| | | | | |
|---|---|---|---|---|
| 2010/0194390 A1* | 8/2010 | Kannengiesser | ...... | A61B 5/0555 |
| | | | | 324/309 |
| 2013/0211240 A1* | 8/2013 | Kitane | ...... | A61B 5/743 |
| | | | | 600/420 |
| 2014/0361770 A1* | 12/2014 | Dannels | ...... | G01R 33/5611 |
| | | | | 324/309 |
| 2015/0173642 A1* | 6/2015 | Blumhagen | ...... | A61B 5/0402 |
| | | | | 600/413 |

* cited by examiner

MRI SYSTEM AND METHOD FOR PERFORMING TIME RESOLVED MR IMAGING OF AN OBJECT WITH GROUPED DATA ACQUISITION

BACKGROUND

Technical Field

Embodiments of the invention relate generally to magnetic resonance imagining ("MRI") technologies and, more specifically, to an MRI system and method for performing time resolved Magnetic Resonance ("MR") imaging of an object with grouped data acquisition.

Discussion of Art

MRI is a widely accepted and commercially available technique for obtaining digitized visual images representing the internal structure of objects having substantial populations of atomic nuclei that are susceptible to nuclear magnetic resonance ("NMR"). Many MRI systems use superconductive magnets to scan a subject/patient via imposing a strong main magnetic field on the nuclei in the subject to be imaged. The nuclei are excited by a radio frequency ("RF") signal at characteristics NMR (Larmor) frequencies. By spatially disturbing localized magnetic fields surrounding the subject and analyzing the resulting RF responses from the nuclei as the excited protons relax back to their lower energy normal state, a map or image of these nuclei responses as a function of their spatial location is generated and displayed. An image of the nuclei responses provides a non-invasive view of a subject's internal structure.

Many MRI systems provide for time resolved imaging and/or acceleration over time for multi-phase dynamic imaging. Such MRI systems typically segment k-space into annular rings, which in turn provides for reduced imaging times via undersampling outer annular rings, as compared to the annular ring encompassing central k-space, and reconstructing the undersampled annular rings via view sharing and/or other mathematical interpolation methods. While such MRI systems provide for improved imaging times, many such MRI systems are unable to incorporate preparation pulses, e.g., fat suppression pulses, inversion recovery pulses, navigation pulses, saturation bands, etc.

Accordingly, such MRI systems usually rely on subtraction of a pre-contrast phase image from post-contrast phase images to suppress unwanted MR signals, e.g., fatty tissue signal. The utilization of subtraction, however, typically limits such MRI systems to vascular applications. Further, many such MRI systems are memory and computation intensive. For example, to suppress fat signals, some MRI systems require a minimum of two unaliased echoes followed by a Dixon fat/water separation. Echo spacing restrictions for such multiple echoes, however, prolongs TE/TR and/or constrains the achievable resolution and imaging field of view ("FOV"). Moreover, keeping a bright fat signal in a source image while separating in reconstruction makes the source image vulnerable to motion artifacts, e.g., bright fat signals show more ghosting than suppressed fat signals.

Further, many such MRI systems are unable to coordinate the sampling of k-space to a triggering signal, e.g., a respiratory gating signal or cardiac gating signal.

What is needed, therefore, is an improved MRI system and method for performing time resolved MR imaging of an object with grouped data acquisition.

BRIEF DESCRIPTION

In an embodiment, an MRI system for performing time resolved MR imaging of an object with grouped data acquisition is provided. The MRI system includes an MRI controller in electronic communication with a magnet assembly and operative to sample a group of data points within a first region of a k-space. The first region includes a central sub-region and a first peripheral sub-region. The MRI controller is further operative to sample a group of data points within a second region of the k-space. The second region includes the central sub-region and a second peripheral sub-region different from the first peripheral sub-region.

In another embodiment, a method for performing time resolved MR imaging of an object with grouped data acquisition is provided. The method includes sampling a group of data points within a first region of a k-space. The first region includes a central sub-region and a first peripheral sub-region. The method further includes sampling a group of data points within a second region of the k-space. The second region includes the central sub-region and a second peripheral sub-region different from the first peripheral sub-region.

In yet another embodiment, a non-transitory computer readable medium storing instructions configured to adapt an MRI controller for performing time resolved MR imaging of an object with grouped data acquisition is provided. The stored instructions are configured to adapt the MRI controller to sample a group of data points within a first region of a k-space. The first region includes a central sub-region and a first peripheral sub-region. The stored instructions are further configured to adapt the MRI controller to sample a group of data point within a second region of the k-space. The second region includes the central sub-region and a second peripheral sub-region different from the first peripheral sub-region.

DRAWINGS

The present invention will be better understood from reading the following description of non-limiting embodiments, with reference to the attached drawings, wherein below.

DETAILED DESCRIPTION

Reference will be made below in detail to exemplary embodiments of the invention, examples of which are illustrated in the accompanying drawings. Wherever possible, the same reference characters used throughout the drawings refer to the same or like parts, without duplicative description.

As used herein, the terms "substantially," "generally," and "about" indicate conditions within reasonably achievable manufacturing and assembly tolerances, relative to ideal desired conditions suitable for achieving the functional purpose of a component or assembly. As used herein, "electrically coupled", "electrically connected", "electronic communication", and "electrical communication" mean that the referenced elements are directly or indirectly connected such that an electrical current may flow from one to the other. The connection may include a direct conductive connection, i.e., without an intervening capacitive, inductive or active element, an inductive connection, a capacitive connection, and/or any other suitable electrical connection. Intervening components may be present.

Further, while the embodiments disclosed herein are described with respect to a standalone MRI system, it is to be understood that embodiments of the present invention may be applicable to other imaging systems that incorporate MRI technologies such as PET/MRIs. Further still, as will be appreciated, embodiments of the present invention related imaging systems may be used to analyze tissue generally and are not limited to human tissue.

Figure 1:
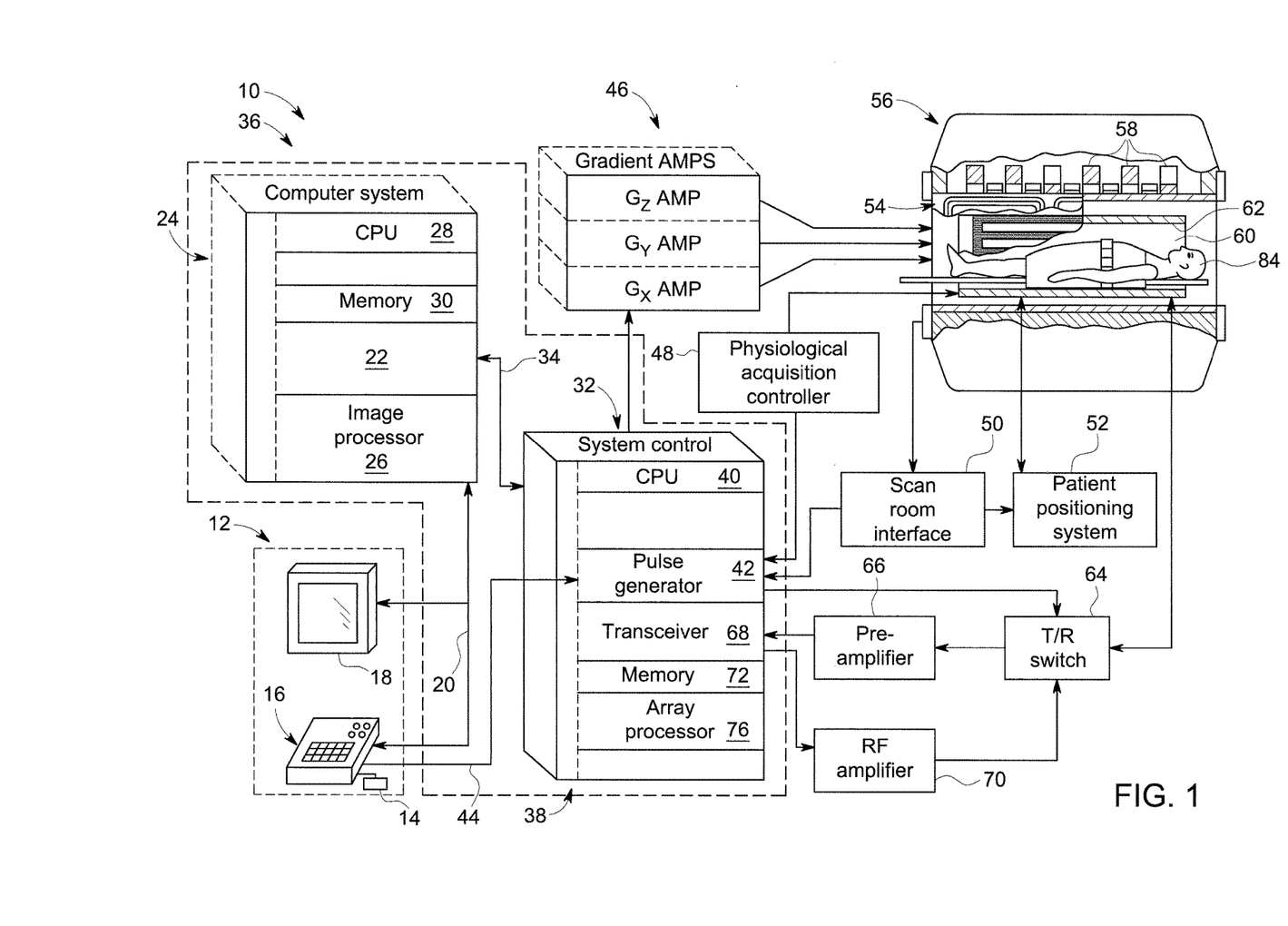
FIG. 1 is a block diagram of an exemplary MRI system in accordance with an embodiment of the invention.

Referring now to FIG. 1, the major components of an MRI system 10 incorporating an embodiment of the invention are shown. Operation of the system 10 is controlled from the operator console 12, which includes a keyboard or other input device 14, a control panel 16, and a display screen 18. The console 12 communicates through a link 20 with a separate computer system 22 that enables an operator to control the production and display of images on the display screen 18. The computer system 22 includes a number of modules, which communicate with each other through a backplane 24. These include an image processor module 26, a CPU module 28 and a memory module 30, which may include a frame buffer for storing image data arrays. The computer system 22 communicates with a separate system control or control unit 32 through a high-speed serial link 34. The input device 14 can include a mouse, joystick, keyboard, track ball, touch activated screen, light wand, voice control, or any similar or equivalent input device, and may be used for interactive geometry prescription. The computer system 22 and the MRI system control 32 collectively form an "MRI controller" 36.

The MRI system control 32 includes a set of modules connected together by a backplane 38. These include a CPU module 40 and a pulse generator module 42, which connects to the operator console 12 through a serial link 44. It is through link 44 that the system control 32 receives commands from the operator to indicate the scan sequence that is to be performed. The pulse generator module 42 operates the system components to execute the desired scan sequence and produces data which indicates the timing, strength and shape of the RF pulses produced, and the timing and length of the data acquisition window. The pulse generator module 42 connects to a set of gradient amplifiers 46, to indicate the timing and shape of the gradient pulses that are produced during the scan. The pulse generator module 42 can also receive patient data from a physiological acquisition controller 48 that receives signals from a number of different sensors connected to the patient, such as ECG signals from electrodes attached to the patient. And finally, the pulse generator module 42 connects to a scan room interface circuit 50, which receives signals from various sensors associated with the condition of the patient and the magnet system. It is also through the scan room interface circuit 50 that a patient positioning system 52 receives commands to move the patient to the desired position for the scan.

The pulse generator module 42 operates the gradient amplifiers 46 to achieve desired timing and shape of the gradient pulses that are produced during the scan. The gradient waveforms produced by the pulse generator module 42 are applied to the gradient amplifier system 46 having Gx, Gy, and Gz amplifiers. Each gradient amplifier excites a corresponding physical gradient coil in a gradient coil assembly, generally designated 54, to produce the magnetic field gradients used for spatially encoding acquired signals. The gradient coil assembly 54 forms part of a magnet assembly 56, which also includes a polarizing magnet 58 (which in operation, provides a homogenous longitudinal magnetic field $B_0$ throughout a target volume 60 that is enclosed by the magnet assembly 56) and a whole-body (transmit and receive) RF coil 62 (which, in operation, provides a transverse magnetic field $B_1$ that is generally perpendicular to $B_0$ throughout the target volume 60).

The resulting signals emitted by the excited nuclei in the patient may be sensed by the same RF coil 62 and coupled through the transmit/receive switch 64 to a preamplifier 66. The amplifier MR signals are demodulated, filtered, and digitized in the receiver section of a transceiver 68. The transmit/receive switch 64 is controlled by a signal from the pulse generator module 42 to electrically connect an RF amplifier 70 to the RF coil 62 during the transmit mode and to connect the preamplifier 66 to the RF coil 62 during the receive mode. The transmit/receive switch 64 can also enable a separate RF coil (for example, a surface coil) to be used in either transmit or receive mode.

The MR signals picked up by the RF coil 62 are digitized by the transceiver module 68 and transferred to a memory module 72 in the system control 32. A scan is complete when an array of raw k-space data (74 in FIG. 3) has been acquired in the memory module 72. This raw k-space data/datum is rearranged into separate k-space data arrays for each image to be reconstructed, and each of these is input to an array processor 76 which operates to Fourier transform the data into an array of image data. This image data is conveyed through the serial link 34 to the computer system 22 where it is stored in memory 30. In response to commands received from the operator console 12, this image data may be archived in long-term storage or it may be further processed by the image processor 26 and conveyed to the operator console 12 and presented on the display 18.

Figure 2:
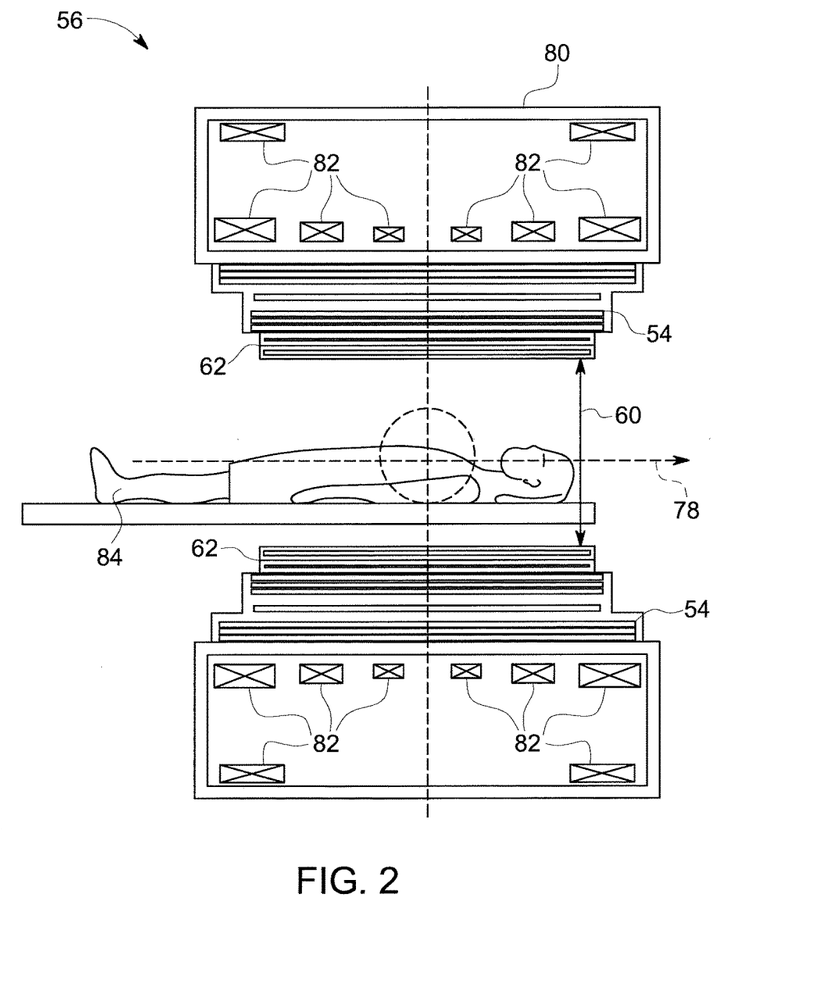
FIG. 2 is a schematic cross-sectional view of a magnet assembly of the MRI system of FIG. 1.

Referring now to FIG. 2, a schematic side elevation view of the magnet assembly 56 is shown in accordance with an embodiment of the invention. The magnet assembly 56 is cylindrical in shape having a center axis 78. The magnet assembly 56 includes a cryostat 80 and one or more radially aligned longitudinally spaced apart superconductive coils 82. The superconductive coils 82 are capable of carrying large electrical currents and are designed to create the $B_0$ field within the patient/target volume 60. As will be appreciated, the magnet assembly 56 may further include both a terminal shield and a vacuum vessel (not shown) surrounding the cryostat 80 in order to help insulate the cryostat 80 from heat generated by the rest of the MRI system (10 in FIG. 1). The magnet assembly 56 may still further include other elements such as covers, supports, suspension members, end caps, brackets, etc. (not shown). While the embodiment of the magnet assembly 56 shown in FIGS. 1 and 2 utilizes a cylindrical topology, it should be understood that topologies other than cylindrical may be used. For example, a flat geometry in a split-open MRI system may also utilize embodiments of the invention described below. As further shown in FIG. 2, an object/patient/imaged subject 84 is inserted into the magnet assembly 56.

Figure 3:
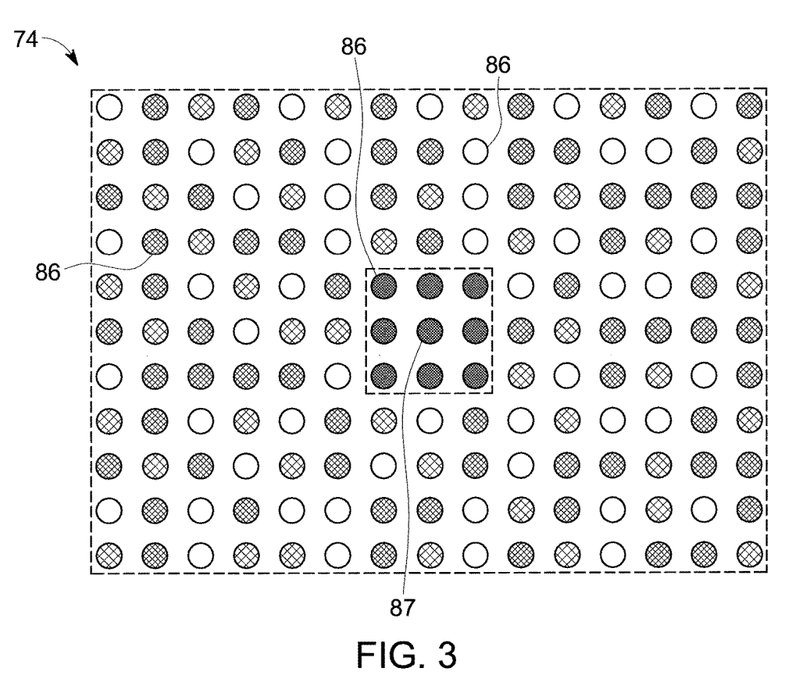
FIG. 3 is a diagram of a k-space of the MRI system of FIG. 1 in accordance with an embodiment of the invention.

Referring now to FIG. 3, a representation of the k-space 74 is shown including a plurality of data points 86 arranged into rows and columns forming an array having a center 87. While FIG. 3 depicts the k-space 74 as a two-dimensional ("2D") array, it will be understood that the k-space 74 may be three-dimensional or higher. The data points 86 represent the values of the signals emitted by the excited nuclei as received by the RF coil 62, e.g., each data point 86 represents an echo. For example, as shown in FIG. 3, each of the data points 86 may represent a gradient echo received by the RF coil 62 at T/R. As will be appreciated, the MRI controller 36 populates the k-space 74 by sampling one or more regions of the k-space 74 at a time. In other words, the MRI controller directs the magnet assembly 56, i.e., the gradient coils 56 and/or the RF coil 62, to energize and sense one or more regions of the imaged subject/patient 84 corresponding to the regions of k-space 74 that the MRI controller 36 intends to populate. In particular, and as will be explained in greater detail below, embodiments of the invention undersample peripheral sub-regions of the k-space 74 while repeatedly sampling a central sub-region of the k-space 74.

Figure 4:
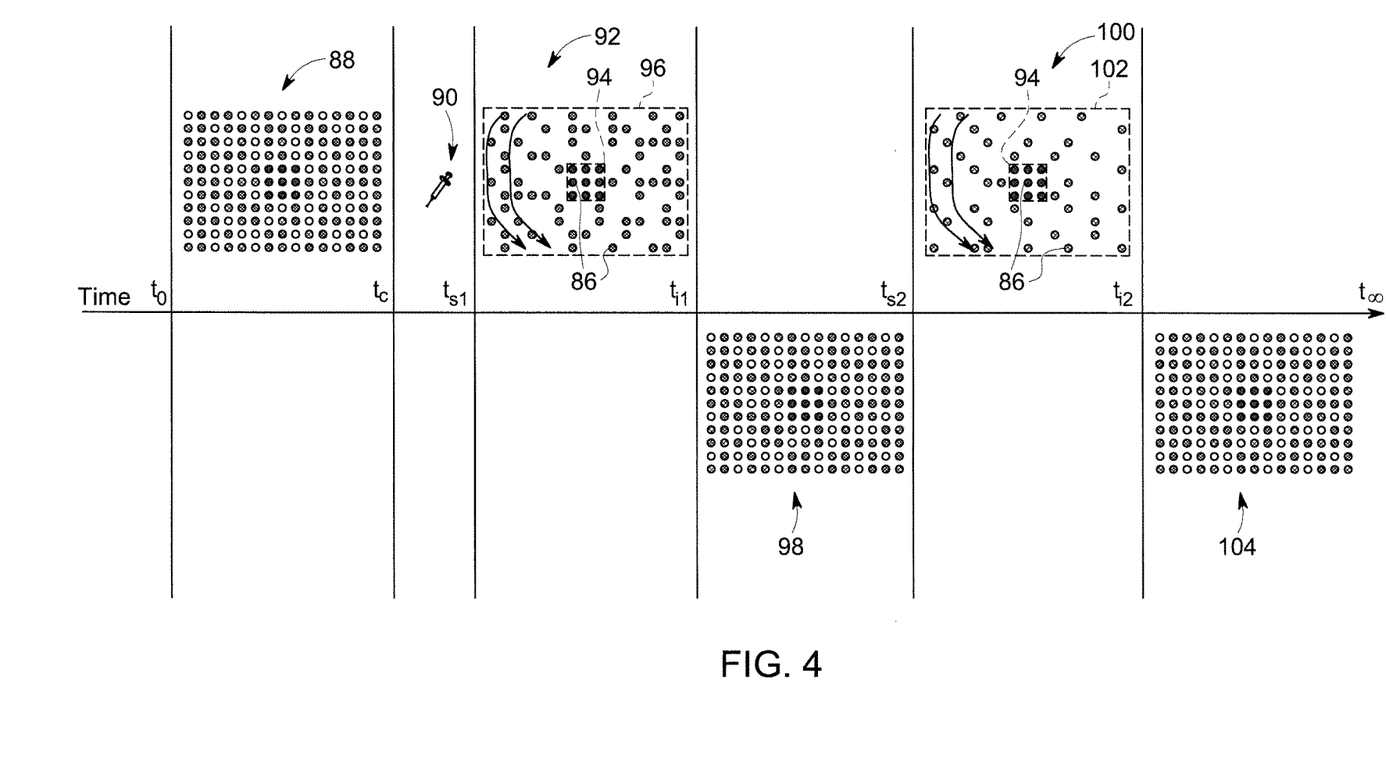
FIG. 4 is a timeline depicting the sampling of the k-space of FIG. 3 by the MRI system of FIG. 1 in accordance with an embodiment of the invention.

For example, illustrated in FIG. 4 is a timeline representing the sampling of the k-space 74 over time from $t_0$ to $t_\infty$, where $t_0$ is the beginning of the MRI scanning procedure and $t_\infty$ is the end of the MRI scanning procedure. As shown in FIG. 4, a baseline 88 of the k-space 74 may be obtained by the MRI controller 36. The baseline 88 may be a sampling of the entire k-space 74.

Once the baseline 88 has been obtained, a contrast agent 90, e.g., Gadolinium, may be injected into the object 84 at $t_c$.

After injection of the contrast agent 90, the MRI controller 36 then samples a first region 92 at $t_{s1}$. As shown in FIG. 4, the first region 92 includes a central sub-region 94 and a first peripheral sub-region 96. The central-sub region 94 includes data points 86 that are at and/or within a defined distance from the center 87 (FIG. 3) of the k-space 74, also referred to herein as "central k-space." The first peripheral sub-region 96 includes data points 86 that are not within the central-sub region 94.

Next, at $t_{i1}$, the MRI controller 36 may compute regions of the k-space 74 not included in the first region 96 based at least in part on at least one of the baseline 88, the central sub-region 94, and the first peripheral sub-region 96. As will be understood, the MRI controller 36 may use various interpolation methods to fill in the data points 86 not sampled/included in the first region 92 so as to produce a first phase 98, e.g., a version of the k-space 74 wherein all data points 86 have been assigned values either through sampling and/or interpolation.

The MRI controller 36 then samples a second region 100 at $t_{s2}$. As further shown in FIG. 4, the second region 100 includes the central sub-region 94 and a second peripheral sub-region 102 that is different than the first peripheral sub-region 96. In other words, the second peripheral sub-region 102 includes data points 86 that are not within the central-sub region 94 or within the first peripheral sub-region 96.

After having sampled the second region 100, the MRI controller 36 may then, at $t_{i2}$, compute regions of the k-space 74 not included in the second region 100 based at least in part on at least one of the baseline 88, the central sub-region 94, and the second peripheral sub-region 102. As will be understood, the MRI controller 36 may use interpolation methods like the ones used to compute the first phase 98 to update and/or fill in data points 86 not sampled/included in the second region 100. Such interpolation in turn results in the production/generation of a second phase 104, e.g., another version of the k-space 74 like the first phase 98 but with updated data points 86.

As will be appreciated, the MRI controller 36 may continue to sample additional regions, wherein each region includes the central sub-region 94 and a peripheral sub-region different from all the other peripheral sub-regions. The MRI controller 36 may also compute additional phases after the sampling of each additional region. For example, in embodiments, the MRI controller 36 may sample three or more regions and compute three or more phases. After having sampled a given number of regions and having computed a given number of phases, the MRI controller 36 may then generate one or more images based on the last produced phase. Thus, the one or more images are based at least in part on the first region, the second region, etc. As will be appreciated, in embodiments, the MRI controller 36 may utilize the baseline 88 to produce/generate a mask for subsequent image subtraction, i.e., the one or more images generated by the MRI controller 36 may be based at least in part on a mask. Further, the generated images may be still images and/or frames that form a moving image.

Figure 5:
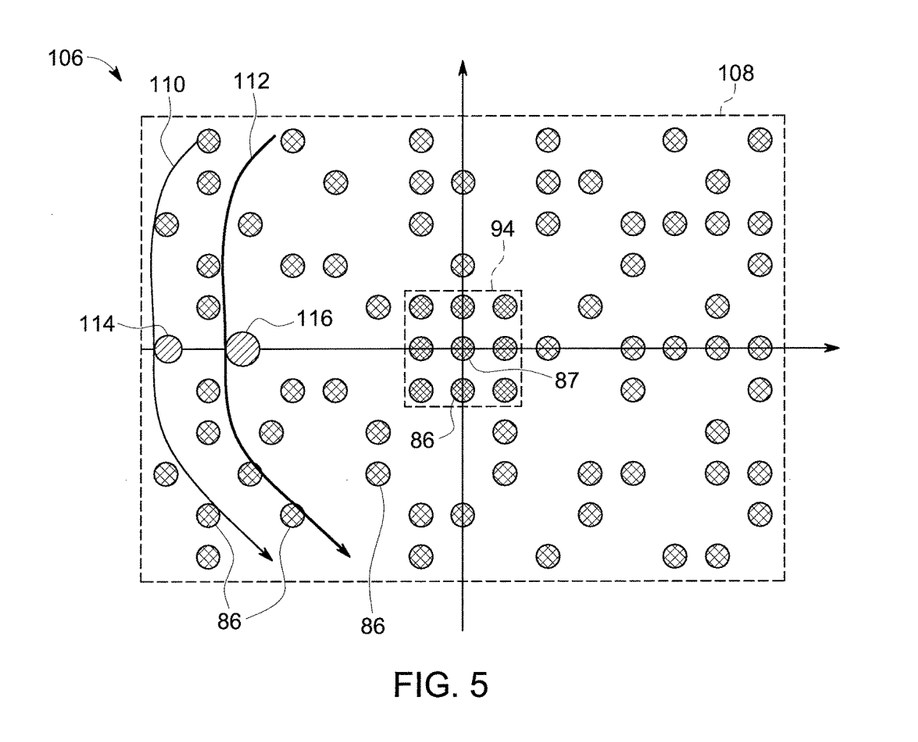
FIG. 5 is a diagram depicting the sampling of a region of the k-space of FIG. 3 by the MRI system of FIG. 1 in accordance with an embodiment of the invention.

Turning to FIG. 5, a region 106 of the k-space 74 that includes the central sub-region 94 and a peripheral sub-region 108 is shown. As will be understood, the region 106 is representative of the first 92, the second 100, and/or additional regions sampled by the MRI controller 36. Similarly, the peripheral sub-region 108 is representative of the first 96, the second 102, and/or additional peripheral sub-regions of regions sampled by the MRI controller 36. As such, in embodiments, the MRI controller 36 may sample the region 106 via sampling one or more groups 110, 112 of data points 86 within the region 106, and for each group 110, 112, the MRI controller 36 may transmit a preparation pulse into the subject/patient/object 84 prior to sampling the group 110, 112. As will be appreciated, the groups 110, 112 may be continuous segments/trajectories of data points 86 within the region 106, and/or a non-continuous collection of data points 86 within the region 106. The groups 110, 112 may include data points 86 within just the peripheral sub-region 108, just within the central sub-region 94, and/or a mixture of data points 86 within both the peripheral sub-region 108 and the central sub-region 94. Further, the preparation pulses may be fat suppression pulses, inversion recovery pulses, saturation pulses, navigation pulses, diffusion pulses, and/or any other type of preparation pulse.

As further shown in FIG. 5, each of the groups 110, 112 includes a critical data point (shown as 114 and 116 for groups 110 and 112, respectively) which is the data point 86 within a group 110, 112 that is the closest to the center 87 of the k-space 74. As such, in embodiments, the MRI controller 36 may, for each of the groups 110, 112, sample the critical data point 114, 116 within the group 110, 112 when a signal property of the object 84 is at a desired level after having been altered by the preparation pulse transmitted prior to sampling of the group 110, 112. As will be understood, the desired level may be a null value, i.e., near zero signal emissions, and/or any other desired condition of a signal property achievable via a preparation pulse.

Figure 6:
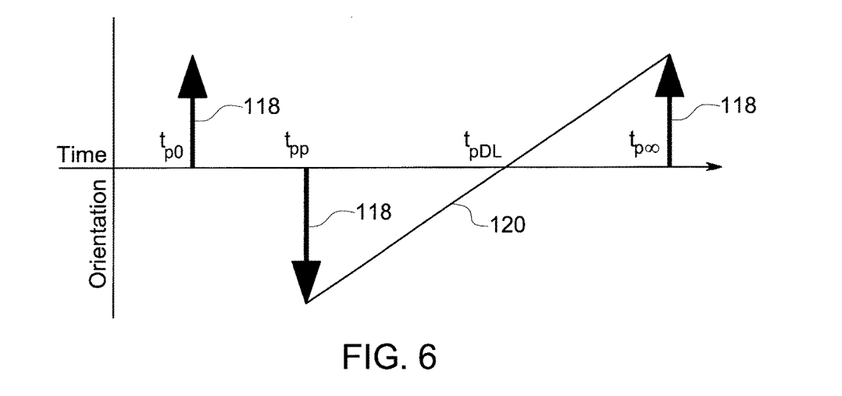
FIG. 6 is a timeline depicting the affect of a preparation pulse on a signal property of an object imaged by the MRI system of FIG. 1, wherein the preparation pulse is transmitted into the object by a magnet assembly of the MRI system of FIG. 1 in accordance with an embodiment of the invention.

Accordingly, referring now to FIG. 6, a timeline showing the affect of a preparation pulse on a signal property (represented by arrow 118) of the object/patient 84 is shown from the time $t_{p0}$ before the preparation pulse has been transmitted into the object/patient 84, to the time $t_{p\infty}$ where the signal property 118 has fully recovered from the affect of the preparation pulse. Accordingly, the MRI controller 36 may transmit a preparation pulse via the magnet assembly 56 into the object 84 at $t_{pp}$ which alters the signal property 118 (depicted by the reversal of the arrow 118 from up at $t_{p0}$ to down at $t_{pp}$). As shown in FIG. 6, after being affected/altered by the preparation pulse at $t_{pp}$, the signal property 118 recovers (depicted by line 120) over a period of time extending from $t_{pp}$ to $t_{p\infty}$. As further shown in FIG. 6, the signal property 118 reaches the desired level at $t_{pDL}$ (represented by the intersection of the line 20 and the time axis) along its path to full recovery at $t_{p\infty}$.

For example, in embodiments, the MRI controller 36 may transmit a fat suppression preparation pulse into the object 84 prior to sampling a first group 110 of the region 106, which in turn causes the fat signals 118 within the object 84 to reverse. The MRI controller 36 then begins sampling the data points 86 within the first group 110 in such a way that the MRI controller 36 samples a first critical data point 114 of the first group 110 at and/or near $t_{pDL}$. As will be appreciated, sampling the critical data point 114 at and/or near $t_{pDL}$ results in a sampling in which the fat signals 118 have a null, or nearly null, value. The Mill controller 36 then samples the remaining data points 86 within the first group 110. After having sampled the first group 110, the Mill controller 36 then transmits another fat preparation pulse into the object 84 prior to sampling a second group 112 of the region 106, which in turn causes the fat signals 118 within the object 84 to again reverse. The MRI controller 36 then begins sampling the data points 86 within the second group 112 in such a way that the MRI controller 36 samples a second critical data point 116 of the second group 112 at and/or near $t_{pDL}$ so that the fat signals 118 have a null, or nearly null, value. The MRI controller 36 then samples the remaining data points 86 within the second group 112. As will be further understood, the MRI controller 36 may sample additional groups of the region 106 in a similar manner until all of the data points 86 within the region 106 has been sampled. Once the region 106 has been sampled, the MRI controller 36 proceeds to sample any remaining additional regions in a similar manner, which as will be appreciated, results in one or more fat suppressed contrast time resolved images. While the previous example was described with respect to a fat suppression preparation pulse, it is to be understood that the above process is applicable to other types of preparation pulses. For example, in embodiments, the preparation pulses may be navigation pulses applied for respiratory motion minimization.

As will be appreciated, in order to determine the appropriate timing for sampling the data points 86 in a group 110, 112 such that the critical data point 114, 116 is sampled at and/or near $t_{pDL}$, in embodiments, the MRI controller 36 determines the number $n_{echo}$ of data points 86 per group by taking the ceiling (rounding up to the nearest integer) of the total number $n_t$ of data points 86 within the region 106 divided by a pre-determined number of segments $n_{egg}$: $n_{echo}=\text{ceil}(n_t/n_{seg})$. The $n_t$ data points 86 may then be ordered according to their $k_z$ values, which in embodiments, may be a descending order. The data points 86 may then be separated into $n_{echo}$ collections where each collection contains $n_{seg}$ data points 86. The data points 86 may then be reordered so that each group 110, 112 includes data points 86 from all of the collections and such that one data point 86 from each collection is assigned to a group 110, 112. Each group 110, 112 may then be sampled in descending order of $k_z$ values.

Figure 7:
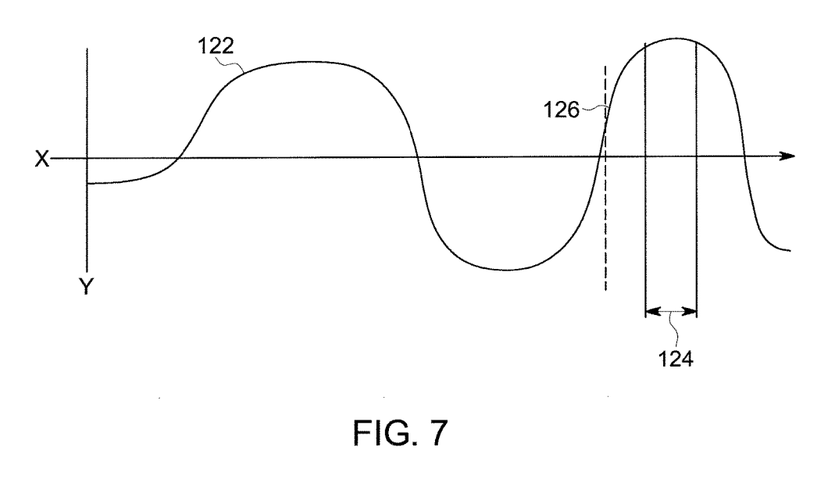
FIG. 7 is a graph of a triggering signal received by an MRI controller of the MRI system of FIG. 1 in accordance with an embodiment of the invention.

Further, and referring now to FIGS. 5 and 7, in embodiments, each of the groups 110, 112 of data points 86 may be sampled based at least in part on a triggering signal 122. The triggering signal 122 may be a respiratory gating signal, a cardiac gating signal, and/or any type of signal capable of monitoring a physiological event to synchronize data acquisition with respect to the physiological process, received by the MRI controller 36. While FIG. 7 depicts the triggering signal 122 as an analog wave, it will be understood that the triggering signal 122 may be any type of signal, to include digital and/or square waves. As shown in FIG. 7, the triggering signal 122 may define an acquisition window 124 during which one or more data points, e.g., the critical data point 114, 116 within the group 110, 112 are sampled. The acquisition window 124 may be based at least in part on a trigger point 126 disposed along the triggering signal 122. In certain aspects, the MRI controller 36 monitors the triggering signal 122 to determine when the control signal 122 reaches the trigger point 126, at which time the MRI controller 36 begins sampling a group 110, 112 of data points 86. The trigger point 126 may be selected such that the data points 86 sampled during the acquisition window 124 are sampled at a desired time in relation to a region of the triggering signal 122.

For example, in embodiments where the triggering signal 122 is a respiratory gating signal, the trigger point 126 may be disposed/selected along the triggering signal 122 such that the acquisition window 124 is centered on and/or near the patient's 84 peak body inhalation position, depicted in FIG. 7 as the maxima of the triggering signal 122, and such that a particular set of data points 86, e.g., data points 86 in the group 110 within a certain distance from the center of k-space 87, are sampled by the MRI controller 36 within the acquisition window 124. In other words, the trigger point 126 may be disposed on the triggering signal 122 so as to initiate sampling of the group 110 such that the data points 86 of the group 110 closest to the center of k-space 87 are sampled at the patient's 84 peak body inhalation position. As will be appreciated, the MRI controller 36 may then subsequently sample additional groups 112 in the same manner.

Finally, it is also to be understood that the system 10 may include the necessary electronics, software, memory, storage, databases, firmware, logic/state machines, microprocessors, communication links, displays or other visual or audio user interfaces, printing devices, and any other input/output interfaces to perform the functions described herein and/or to achieve the results described herein. For example, as previously mentioned, the system may include at least one processor and system memory/data storage structures, which may include random access memory ("RAM") and read-only memory ("ROM"). The at least one processor of the system 10 may include one or more conventional microprocessors and one or more supplementary co-processors such as math co-processors or the like. The data storage structures discussed herein may include an appropriate combination of magnetic, optical and/or semiconductor memory, and may include, for example, RAM, ROM, flash drive, an optical disc such as a compact disc and/or a hard disk or drive.

Additionally, a software application that adapts the controller to perform the methods disclosed herein may be read into a main memory of the at least one processor from a computer-readable medium. The term "computer-readable medium", as used herein, refers to any medium that provides or participates in providing instructions to the at least one processor of the system 10 (or any other processor of a device described herein) for execution. Such a medium may take many forms, including but not limited to, non-volatile media and volatile media. Non-volatile media include, for example, optical, magnetic, or opto-magnetic disks, such as memory. Volatile media include dynamic random access memory (DRAM), which typically constitutes the main memory. Common forms of computer-readable media include, for example, a floppy disk, a flexible disk, hard disk, magnetic tape, any other magnetic medium, a CD-ROM, DVD, any other optical medium, a RAM, a PROM, an EPROM or EEPROM (electronically erasable programmable read-only memory), a FLASH-EEPROM, any other memory chip or cartridge, or any other medium from which a computer can read.

While in embodiments, the execution of sequences of instructions in the software application causes at least one processor to perform the methods/processes described herein, hard-wired circuitry may be used in place of, or in combination with, software instructions for implementation of the methods/processes of the present invention. Therefore, embodiments of the present invention are not limited to any specific combination of hardware and/or software.

It is further to be understood that the above description is intended to be illustrative, and not restrictive. For example, the above-described embodiments (and/or aspects thereof) may be used in combination with each other. Additionally, many modifications may be made to adapt a particular situation or material to the teachings of the invention without departing from its scope.

For example, in an embodiment, an MRI system for performing time resolved MR imaging of an object with grouped data acquisition is provided. The MRI system includes an MRI controller in electronic communication with a magnet assembly and operative to sample a group of data points within a first region of a k-space. The first region includes a central sub-region and a first peripheral sub-region. The MRI controller is further operative to sample a group of data points within a second region of the k-space. The second region includes the central sub-region and a second peripheral sub-region different from the first peripheral sub-region. In certain embodiments, the MRI controller is further operative to sample groups of data points within three or more regions of the k-space, each of the three or more regions including the central sub-region and a peripheral sub-region different from the other peripheral sub-regions. In certain embodiments, for each of the groups of data points, a preparation pulse is transmitted into the object prior to sampling of the group. In certain embodiments, the MRI controller is further operative to: for each of the groups of data points, sample a critical data point within the group when a signal property of the object is at a desired level after having been altered by the preparation pulse transmitted prior to sampling of the group, the critical data point being the data point of the group that is the closest to a center of the k-space. In certain embodiments, the preparation pulse transmitted into the object for each of the groups of data points prior to sampling is at least one of: a fat suppression pulse; an inversion recovery pulse; a saturation pulse; a navigation pulse; a diffusion pulse; and a tagging pulse. In certain embodiments, each of the groups of data points are sampled based at least in part on a triggering signal that defines an acquisition window during which one or more data points within the group are sampled. In certain embodiments, the triggering signal is at least one of a respiratory gating signal, and a cardiac gating signal. In certain embodiments, the MRI controller is further operative to obtain a baseline of the k-space via the magnet assembly prior to injection of a contrast agent into the object, the groups of data points being sampled after injection of the contrast agent. In certain embodiments, the MRI controller is further operative to compute regions of the k-space not included in the first region based at least in part on at least one of the baseline, the central sub-region, and the first peripheral sub-region prior to sampling the group of data points within the second region. In certain embodiments, the MRI controller is further operative to compute regions of the k-space not included in the second region based at least in part on at least one of the baseline, the central sub-region, and the second peripheral sub-region after sampling the group of data points within the second region. In certain embodiments, the MRI controller is further operative to: generate a mask based at least in part on the baseline; and generate one or more images based at least in part on the first region, the second region, and the mask.

Other embodiments provide for a method for performing time resolved MR imaging of an object with grouped data acquisition. The method includes sampling a group of data points within a first region of a k-space. The first region includes a central sub-region and a first peripheral sub-region. The method further includes sampling a group of data points within a second region of the k-space. The second region includes the central sub-region and a second peripheral sub-region different from the first peripheral sub-region. In certain embodiments, the method further includes sampling groups of data points within three or more regions of the k-space, each of the three or more regions including the central sub-region and a peripheral sub-region different from the other peripheral sub-regions. In certain embodiments, the method further includes: for each of the groups of data points, transmitting a preparation pulse into the object prior to sampling of the group. In certain embodiments, the method further includes: for each of the groups of data points, sampling a critical data point within the group when a signal property of the object is at a desired level after having been altered by the preparation pulse transmitted prior to sampling of the group, the critical data point being the data point of the group that is the closest to a center of the k-space. In certain embodiments, the preparation pulse transmitted into the object for each of the groups of data points prior to sampling is at least one of: a fat suppression pulse; an inversion recovery pulse; a saturation pulse; a navigation pulse; a diffusion pulse; and a tagging pulse. In certain embodiments, each of the groups of data points are sampled based at least in part on a triggering signal that defines an acquisition window during which one or more data points within the group are sampled. In certain embodiments, the triggering signal is at least one of a respiratory gating signal, and a cardiac gating signal. In certain embodiments, the method further includes obtaining a baseline of the k-space prior to injection of a contrast agent into the object. In such embodiments, sampling the groups of data points occurs after injection of the contrast agent. In certain embodiments, the method further includes computing regions of the k-space not included in the first region based at least in part on at least one of the baseline, the central sub-region, and the first peripheral sub-region prior to sampling the group of data points within the second region. In certain embodiments, the method further includes computing regions of the k-space not included in the second region based at least in part on at least one of the baseline, the central sub-region, and the second peripheral sub-region after sampling the group of data points within the second region. In certain embodiments, the method further includes: generating a mask based at least in part on the baseline; and generating one or more images based at least in part on the first region, the second region, and the mask.

Yet still other embodiments provide for a non-transitory computer readable medium storing instructions configured to adapt an MRI controller for performing time resolved MR imaging of an object with grouped data acquisition. The stored instructions are configured to adapt the MRI controller to sample a group of data points within a first region of a k-space. The first region includes a central sub-region and a first peripheral sub-region. The stored instructions are further configured to adapt the MRI controller to sample a group of data point within a second region of the k-space. The second region includes the central sub-region and a second peripheral sub-region different from the first peripheral sub-region. In certain embodiments, for each of the groups of data points, a preparation pulse is transmitted into the object prior to sampling of the group. In such embodiments, the stored instructions are further configured to adapt the MRI controller to: for each of the groups of data points, sample a critical data point within the group when a signal property of the object is at a desired level after having been altered by the preparation pulse transmitted prior to sampling of the group, the critical data point being the data point of the group that is the closest to a center of the k-space. In certain embodiments, each of the groups of data points are sampled based at least in part on a triggering signal that defines an acquisition window during which one or more data points within the group are sampled.

Accordingly, as will be appreciated, by resampling the central sub-region as the same time as sampling each of the peripheral sub-regions, some embodiments of the invention provide an MRI scanning procedure that incorporates preparation pulses without significant overhead, e.g., additional scan acquisitions. As such, some embodiments of the invention provide for a framework to segment the sampling of the data points into smaller "chunks," which in turn provides for gated acquisitions, e.g., cardiac gating and/or respiratory gating.

Further, some embodiments of the invention remove the need for utilizing more restrictive prior art methods of suppressing unwanted signals, i.e., Dixon type fat/water separation dependence for time resolved acquisitions. As such, some embodiments may provide for imagining matrices as high as an MRI systems highest imaging capability, e.g., 1024/1024. Moreover, some embodiments of the invention may have a TR of about 5.5 ms, which as will be appreciated, is an improvement over traditional systems which typically have TRs of about 7.3 ms.

Further still, some embodiments of the present invention provide for more reliable gated acquisitions by enabling segmented trajectories for navigated scans, respiratory gated scans, and/or cardiac gated scans. Some embodiments may also provide for the suppression of bright fat signals and/or other unwanted tissue signals which in turn may reduce motion contamination from such tissues signals. As such, some embodiments of the invention may combine time resolved imaging with Compressed Sensing, which in turn improves the maximum allowed compressed sensing factor, e.g., 1.5, used before seeing image degradation. Accordingly, in some embodiments, the data points included within the central sub-region may be varied from region to region. In other words, in some embodiments, the central sub-region may be sampled differently across the one or more regions.

Additionally, while the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format are not intended to be interpreted as such, unless and until such claim limitations expressly use the phrase "means for" followed by a statement of function void of further structure.

This written description uses examples to disclose several embodiments of the invention, including the best mode, and also to enable one of ordinary skill in the art to practice the embodiments of invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described invention, without departing from the spirit and scope of the invention herein involved, it is intended that all of the subject matter of the above description shown in the accompanying drawings shall be interpreted merely as examples illustrating the inventive concept herein and shall not be construed as limiting the invention.

What is claimed is:

1. An MRI system for performing time resolved MR imaging of an object with grouped data acquisition comprising:
    an MRI controller in electronic communication with a magnet assembly and operative to:
        sample a group of data points within a first region of a k-space, the first region including a central sub-region and a first peripheral sub-region;
        sample a group of data points within a second region of the k-space, the second region including the central sub-region and a second peripheral sub-region different from the first peripheral sub-region; and
        for each of the groups of data points, sample a critical data point within the group when a signal property of the object is at a desired level after having been altered by a preparation pulse transmitted into the object prior to sampling of the group, the critical data point being the data point of the group that is the closest to a center of the k-space.

2. A method for performing time resolved MR imaging of an object with grouped data acquisition comprising:
sampling a group of data points within a first region of a k-space, the first region including a central sub-region and a first peripheral sub-region; and
sampling a group of data points within a second region of the k-space, the second region including the central sub-region and a second peripheral sub-region different from the first peripheral sub-region; and
for each of the groups of data points, sampling a critical data point within the group when a signal property of the object is at a desired level after having been altered by a preparation pulse transmitted into the object prior to sampling of the group, the critical data point being the data point of the group that is the closest to a center of the k-space.

3. An MRI system for performing time resolved MR imaging of an object with grouped data acquisition comprising:
an MRI controller in electronic communication with a magnet assembly and operative to:
sample a group of data points within a first region of a k-space, the first region including a central sub-region and a first peripheral sub-region;
sample a group of data points within a second region of the k-space, the second region including the central sub-region and a second peripheral sub-region different from the first peripheral sub-region;
obtain a baseline of the k-space via the magnet assembly prior to injection of a contrast agent into the object, the groups of data points being sampled after injection of the contrast agent; and
compute regions of the k-space not included in the first region based at least in part on at least one of the baseline, the central sub-region, and the first peripheral sub-region prior to sampling the group of data points within the second region.

4. A method for performing time resolved MR imaging of an object with grouped data acquisition comprising:
sampling a group of data points within a first region of a k-space, the first region including a central sub-region and a first peripheral sub-region;
sampling a group of data points within a second region of the k-space, the second region including the central sub-region and a second peripheral sub-region different from the first peripheral sub-region;
obtaining a baseline of the k-space prior to injection of a contrast agent into the object, wherein sampling the groups of data points occurs after injection of the contrast agent; and
computing regions of the k-space not included in the first region based at least in part on at least one of the baseline, the central sub-region, and the first peripheral sub-region prior to sampling the group of data points within the second region.

5. The MRI system of claim 1, wherein the MRI controller is further operative to:
sample groups of data points within three or more regions of the k-space, each of the three or more regions including the central sub-region and a peripheral sub-region different from the other peripheral sub-regions.

6. The MRI system of claim 1, wherein the preparation pulse transmitted into the object for each of the groups of data points prior to sampling is at least one of: a fat suppression pulse; an inversion recovery pulse; a saturation pulse; a navigation pulse; a diffusion pulse; and a tagging pulse.

7. The MRI system of claim 1, wherein each of the groups of data points are sampled based at least in part on a triggering signal that defines an acquisition window during which one or more data points within the group are sampled.

8. The MRI system of claim 7, wherein the triggering signal is at least one of a respiratory gating signal, and a cardiac gating signal.

9. The MRI system of claim 1, wherein the MRI controller is further operative to:
obtain a baseline of the k-space via the magnet assembly prior to injection of a contrast agent into the object, the groups of data points being sampled after injection of the contrast agent.

10. The MRI system of claim 9, wherein the MRI controller is further operative to:
compute regions of the k-space not included in the first region based at least in part on at least one of the baseline, the central sub-region, and the first peripheral sub-region prior to sampling the group of data points within the second region.

11. The MRI system of claim 10, wherein the MRI controller is further operative to:
compute regions of the k-space not included in the second region based at least in part on at least one of the baseline, the central sub-region, and the second peripheral sub-region after sampling the group of data points within the second region.

12. The MRI system of claim 9, wherein the MRI controller is further operative to:
generate a mask based at least in part on the baseline; and
generate one or more images based at least in part on the first region, the second region, and the mask.

13. The method of claim 2 further comprising:
sampling groups of data points within three or more regions of the k-space, each of the three or more regions including the central sub-region and a peripheral sub-region different from the other peripheral sub-regions.

14. The method of claim 2, wherein the preparation pulse transmitted into the object for each of the groups of data points prior to sampling is at least one of: a fat suppression pulse; an inversion recovery pulse; a saturation pulse; a navigation pulse; a diffusion pulse; and a tagging pulse.

15. The method of claim 2, wherein each of the groups of data points are sampled based at least in part on a triggering signal that defines an acquisition window during which one or more data points within the group are sampled.

16. The method of claim 15, wherein the triggering signal is at least one of a respiratory gating signal, and a cardiac gating signal.

17. The method of claim 2 further comprising:
obtaining a baseline of the k-space prior to injection of a contrast agent into the object; and
wherein sampling the groups of data points occurs after injection of the contrast agent.

18. The method of claim 17 further comprising:
computing regions of the k-space not included in the first region based at least in part on at least one of the baseline, the central sub-region, and the first peripheral sub-region prior to sampling the group of data points within the second region.

19. The method of claim 18 further comprising:
computing regions of the k-space not included in the second region based at least in part on at least one of the baseline, the central sub-region, and the second peripheral sub-region after sampling the group of data points within the second region.

20. The method of claim 17 further comprising:
generating a mask based at least in part on the baseline; and
generating one or more images based at least in part on the first region, the second region, and the mask.

* * * * *